United States Patent
Lin et al.

(10) Patent No.: US 10,672,612 B2
(45) Date of Patent: Jun. 2, 2020

(54) METHOD OF FORMING SEMICONDUCTOR STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Gang-Yi Lin, Taitung County (TW); Feng-Yi Chang, Tainan (TW); Ying-Chih Lin, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/969,788

(22) Filed: May 3, 2018

(65) Prior Publication Data
US 2019/0311901 A1 Oct. 10, 2019

(30) Foreign Application Priority Data
Apr. 4, 2018 (CN) .......................... 2018 1 0297807

(51) Int. Cl.
*H01L 21/033* (2006.01)
*H01L 21/311* (2006.01)

(52) U.S. Cl.
CPC .... *H01L 21/0337* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 2010/0136791 A1 | 6/2010 | Lai et al. | |
| 2012/0244711 A1 | 9/2012 | Yin et al. | |
| 2014/0335694 A1* | 11/2014 | Sills | G03F 7/40 438/696 |
| 2015/0279689 A1* | 10/2015 | Yamamoto | H01L 21/31144 438/713 |

\* cited by examiner

*Primary Examiner* — Asok K Sarkar
(74) *Attorney, Agent, or Firm* — Winston Hsu (57) ABSTRACT

The present invention provides a method of forming a semiconductor structure including the following steps. Firstly, a target layer is formed on a substrate, and a plurality of mandrels is formed on the target layer. Next, a material layer is formed on the target layer to cover the mandrels. Then, an etching process is performed to partially remove each of the mandrel and the material layer covered on each mandrel, to form a plurality of mask. Finally, the target layer is patterned through the masks, to form a plurality of patterns. Through the present invention, each mask comprises an unetched portion of each mandrel and a spacer portion of the material covered on each mandrel, and a dimension of each of the patterns is larger than a dimension of each of the mandrel.

14 Claims, 5 Drawing Sheets

METHOD OF FORMING SEMICONDUCTOR STRUCTURE

BACKGROUND OF THE INVENTION

1. Field of the Invention

The present invention relates to a method of forming semiconductor structure, and more particularly, to a method of forming semiconductor structure by using a self-aligned double patterning (SADP) process for transferring patterns.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For these purposes, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a method of forming a semiconductor structure, in which a multiple patterning process such as a sidewall image transfer (SIT) technique is utilized to form alternately arranged spacers and mandrels with each of the spacers and each of the mandrels to configure as each mask. Then, the masks are used to perform a patterning process, so as to form a semiconductor structure with better structure and enlarged dimension under a simplified process flow.

To achieve the purpose described above, the present invention provides a method of forming a semiconductor structure including the following steps. Firstly, a target layer is formed on a substrate, and a plurality of mandrels is formed on the target layer. Next, a material layer is formed on the target layer to cover the mandrels. Then, an etching process is performed to partially remove each of the mandrels and the material layer covered on each of the mandrels, to form a plurality of masks, with each of the masks including an unetched portion being formed from each of the mandrels and a spacer portion being formed from the material layer covered on each of the mandrels. Finally, the target layer is patterned through the masks to form a plurality of patterns.

To achieve the purpose described above, the present invention provides another method of forming a semiconductor structure including the following steps. Firstly, a target layer is formed on a substrate, and a plurality of mandrels is formed on the target layer. Next, a material layer is formed on the target layer to cover the mandrels. Then, an etching process is performed to partially remove each of the mandrels and the material layer covered on each of the mandrels, to form a plurality of masks. Finally, the target layer is patterned through the masks, to form a plurality of patterns with a dimension of each of the patterns being greater than a dimension of each of the mandrels.

Overall speaking, the present invention provides method through a SIT technique to form target patterns or target structures. In comparison with general SIT technique by defining the target patterns or target structures only through the spacers after completely removing the mandrels, the method of the present invention directly uses an unetched portion formed from each mandrel and an unetched portion (namely the spacer portion) formed from the spacer material layer covering on each mandrel to together form each mask, and then the target patterns or the target structures are defined by such masks. That is, the target patterns or the target structures are allowable to shrink the gaps therebetween or to enlarge the dimension thereof as far as possible, under a maintain pitch such as about 75-85 nm. Thus, through the aforementioned arrangement, the method of the present invention may be practical applied to a semiconductor memory device process such as a DRAM device process, for forming patterns or structures with uniform, enlarged dimension in a denser layout, based on product requirements. In this way, the DRAM device formed accordingly may therefore obtain preferably structure and better device performance thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a method of forming semiconductor structure according to a first preferred embodiment of the present invention; in which:

FIG. 5 to FIG. 9 are schematic diagrams illustrating a method of forming semiconductor structure according to a second preferred embodiment of the present invention; in which:

DETAILED DESCRIPTION

To provide a better understanding of the present invention, preferred embodiments will be described in detail. The preferred embodiments of the present invention are illustrated in the accompanying drawings with numbered elements.

Please refer to FIG. 1 to FIG. 4, which are schematic diagrams illustrating a forming process of a semiconductor structure according to the first embodiment of the present invention. Firstly, a substrate 100 is provided, and a target layer 110 is formed on the substrate 100. The substrate 100 may only include a semiconductor substrate, like a silicon containing substrate, a silicon-on-insulator (SOI) substrate, or includes both of the semiconductor substrate and an insulating layer formed thereon, or includes both of the semiconductor substrate an active element formed therein. In the present embodiment, the target layer 110 for example includes a hard mask layer including a dielectric material like silicon nitride (SiN), silicon oxynitride (SiON) or silicon carbonitride (SiCN), but is not limited thereto. In another embodiment, the target layer 110 may also include a semiconductor layer like a silicon layer or an epitaxial silicon layer, a conductive layer like an aluminum (Al) layer, a copper (Cu) layer or a tungsten (W) layer, or a non-conductive layer like a dielectric layer.

Figure 1:
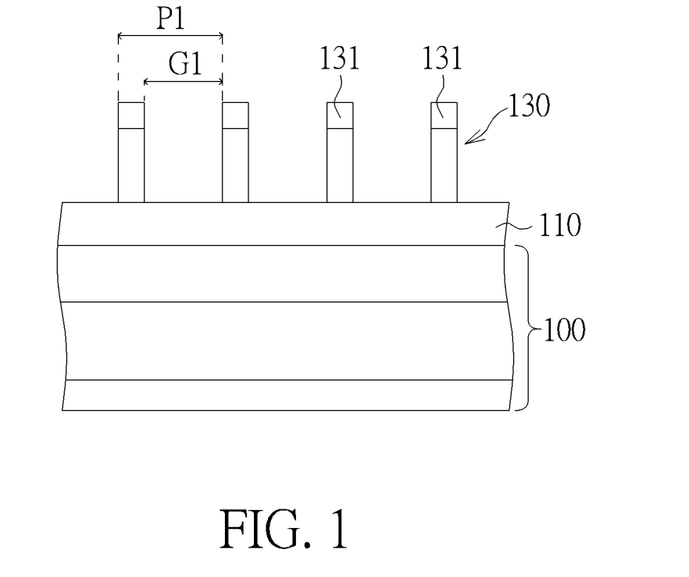
FIG. 1 shows a cross-sectional view of a semiconductor structure after forming mandrels.

Next, a plurality of mandrels 130 is formed on the target layer 110, and the mandrels 130 for example include a material like polysilicon or other materials having etching selectivity related to the target layer 110 underneath, such as silicon oxide (SiO) or silicon nitride (SiN). Also, the forming process of the mandrels 130 may be integrated with a general semiconductor process like a gate process, so that, a plurality of separated gate patterns may be formed to serve as the mandrels 130. Otherwise, the mandrels 130 may also be formed by sequentially forming a material layer (not shown in the drawings) and a plurality of patterned masks 131 on the target layer 110, followed by transferring the patterned masks 131 into the material layer underneath, so that, the patterned material layer may therefore serve as the mandrels 130, as shown in FIG. 1.

Precisely, each of the mandrels 130 is spaced by a gap G1, so as to obtain a same pitch P1 with each other. The gap G1 for example is a minimized size that may be achieved in an exposure process. Also, a length of the pitch P1 is preferably greater than a dimension or a width of each mandrel 130, but is not limited thereto. In one embodiment, an etching process may be optionally performed after forming the mandrels 130, to remove a portion of each mandrels 130, so as to form mandrels (not shown in the drawings) with a finer dimension/width.

Figure 2:
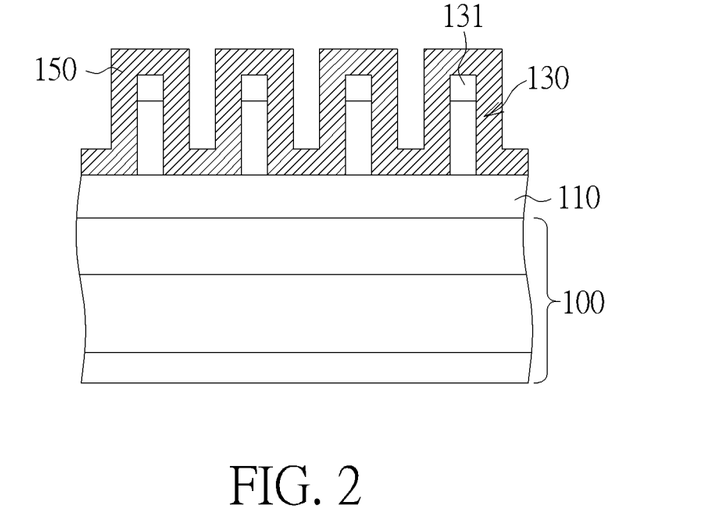
FIG. 2 shows a cross-sectional view of a semiconductor structure after forming a spacer material layer.
Figure 3:
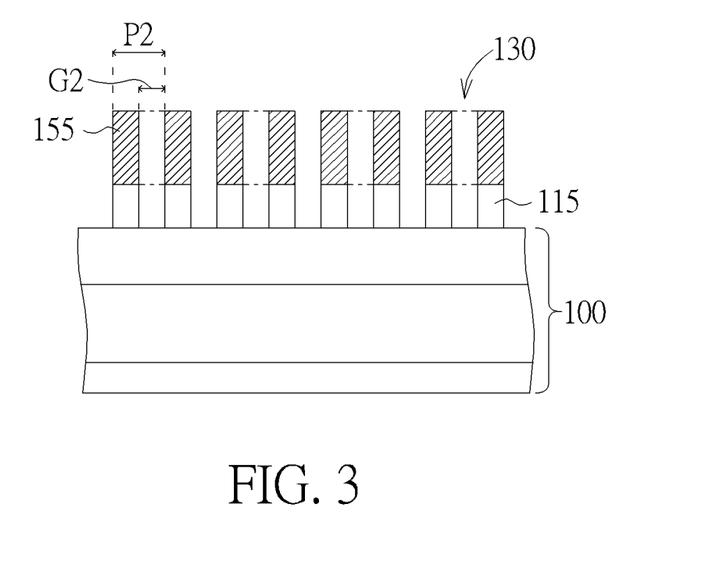
FIG. 3 shows a cross-sectional view of a semiconductor structure after forming patterns.

Next, spacers 155 are formed at two sides of each mandrel 130. The formation of the spacers 155 is accomplished for example by entirely forming a spacer material layer 150 on the substrate 100, to cover the patterned masks 131, the mandrels 130 and the target layer 110 underneath, as shown in FIG. 2. Then, an etching back process is performed on the spacer material layer 150, to selectively remove a portion of the spacer material layer 150. That is a top surface of each of the patterned masks 131 is exposed, so as to form the spacers 155 as shown in FIG. 3. Please noted that, a material of the spacer material layer 150 preferably includes a material which is different from that of the pattern masks 131 and the target layer 110, such as including silicon oxide.

Following these, the patterned masks 131 and the mandrels 130 are completely removed after the etching back process, and the target layer 110 is then patterned by using the spacers 155 as a mask, to form required target patterns 115 or other target structures (not shown in the drawings). The target patterns 115 are formed in accordance with the spacers 155, so that, each of the target patterns 115 is spaced by a gap G2 to obtain a same pitch P2 thereby. It is noted that, a dimension of each gap G2 is smaller than the gap G1 (namely the CD) between original mandrels 130, and is substantially equal to a width of each mandrels 130, as shown in FIG. 3. In the present embodiment, it is preferably to adjust a thickness of each spacer 155 to substantially equal to the dimension/width of each mandrels 130, so that, the pitch P2 of the target patterns 115 formed subsequently may be about a half of the pitch P1 of the mandrels 130, such as being about 75 nanometers (nm) to 85 nm. However, people skilled in the art should fully understand that, the aforementioned conditions such as the dimension or the size of the target patterns 115 are in accordance with the designs such as the dimension or the thickness of the mandrels 130 and the spacers 155 formed in sidewalls image transference (SIT) technique. Although the present embodiment is exemplified by forming the target patterns 115 with a finer pitch P2 and similar dimension in comparison with the spacers 155 and the mandrels 130, the practical forming process is not limited thereto and may be further adjusted based on practical requirements of products.

Figure 4:
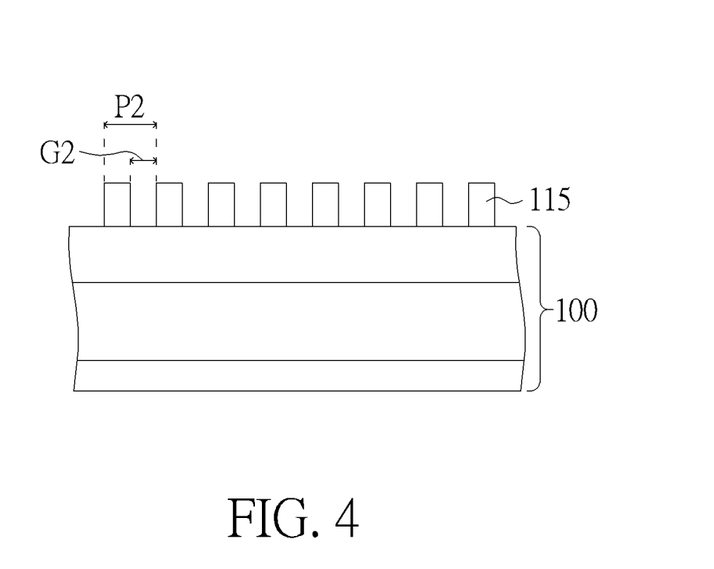
FIG. 4 shows a cross-sectional view of a semiconductor structure after removing a spacer.

Then, as shown in FIG. 4, the spacers 155 are completely removed, to leave the target patterns 115 underneath. In the present embodiment, the target patterns 155 may be further used as a mask in a subsequent etching process, for patterning the substrate 100, such as the semiconductor layer thereof and/or the insulating layer formed on the semiconductor layer. Also, in the embodiment having the semiconductor layer, the conductive layer or the non-conductive layer as the substrate, the target patterns 115 may be used to patterning such semiconductor layer, the conductive layer or the non-conductive layer based on the process requirements of the subsequent process.

According to the above steps, a forming process of a semiconductor structure according to the first embodiment of the present invention is completed. In the present embodiment, the SIT technique is used to form the target patterns 115 or other target structures. Also, through controlling the conditions like pitch, dimension and thickness of the mandrels 130 and the spacers 115, the target patterns 115 or other target structures (not shown in the drawings) formed in the forming process may therefore obtain the relative finer pitch P2 and the relative finer gap G2, in comparison with that of the original mandrels 130. In this way, the forming process of the present embodiment is allowable to form target structures with uniform dimension in a denser layout, under a simplified process flow.

In some situations, in order to meet the requirements of the product, it is necessary to enlarge the size of the target patterns or target structures as far as possible under the aforementioned pitch such as 75 nm to 85 nm. Thus, under the concept of the aforementioned embodiment, the size of the mandrels should be shrunk as far as possible or the thickness should be enlarged as far as possible, to meet the aforementioned conditions. However, excessively shrinking the mandrel size or excessively enlarging the spacer thickness may lead to mandrel collapse issues, or merge or overhang issues caused by the spacer material covering on the mandrels.

Thus, people in the art shall easily realize that the method of forming semiconductor structure of the present invention is not limited to be formed through the aforementioned processes, and may also be formed through other forming methods to meet the product requirements. The following description will detail the different embodiments of the forming method of semiconductor structure in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
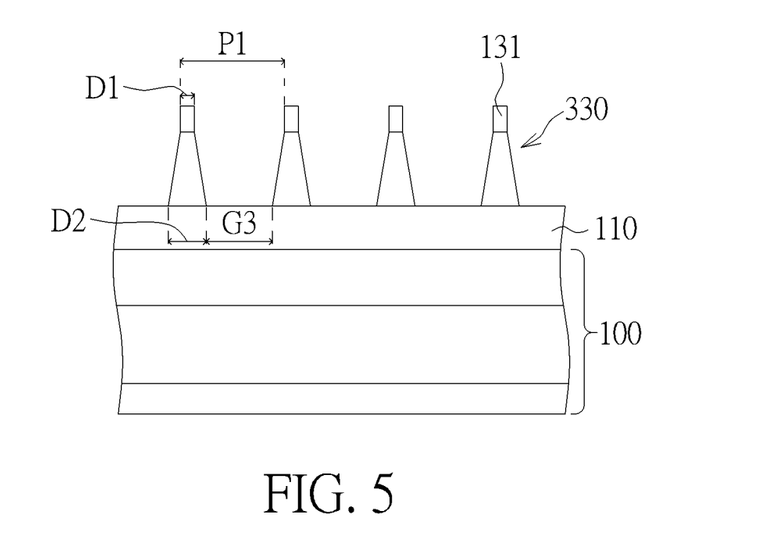
FIG. 5 shows a cross-sectional view of a semiconductor structure after forming mandrels.

Please refer to FIG. 5 to FIG. 9, which are schematic diagrams illustrating a forming process of a semiconductor structure according to the second embodiment of the present invention. In the forming process of the present embodiment, the SIT technique is also used to pattern the target layer 110, and the difference between the present embodiment and the aforementioned first embodiment is in that a plurality of mandrels 330 to have an increased dimension from top to bottom, as shown in FIG. 5. In one embodiment, the formation of the mandrels 330 is accomplished by sequentially forming the material layer (not shown in the drawings) and the pattern mask 131 as shown in FIG. 1 on the target layer 110, and performing an etching process to shrink the entire size of each patterned mask 131, followed by performing an isotropic etching process to pattern the material layer. That is, the patterned material layer may therefore serve as the mandrels 330. Otherwise, the formation of the mandrels 330 may also be accomplished by first performing the isotropic etching process right after the material layer and the pattern mask 131 are formed, to obtain a plurality patterns (not shown in the drawings) with an increased size from top to bottom, followed by performing another etching process to entirely shrink the sizes of the pattern masks 131 and those patterns, so as to form the mandrels 330.

According to the aforementioned process, each of the mandrels 330 may include a relative smaller dimension D1 at the top portion thereof, with the dimension D1 being smaller than that of the mandrels 130, such as being about ½ to ¼ of the dimension of the mandrels 130, but not limited thereto. On the other hand, each of the mandrels 330 may include a relative greater dimension D2 at the bottom portion thereof due to the aforementioned isotropic etching, with the dimension D2 being about 1.5 to 2.5 times greater than the dimension D1, but not limited thereto. For easy description purpose, each of the mandrels 330 of the present embodiment may optionally include a same pitch P1 as that of the mandrels 130 in the aforementioned first embodiment. However, the practical features of the mandrels 330 formed in the present embodiment are not limited thereto, and may be further adjusted according to the product requirements. Furthermore, although each of the mandrels 330 includes the same pitch P1, the gap G3 between each of the mandrels 330 is not the same as the gap G1 between each mandrel 130 because the increased size of the mandrels 330. Preferably, the gap G3 between each of the mandrels 330 is smaller than the gap G1 between each mandrel 130, as shown in FIG. 5. However, in another embodiment, a gap (not shown in the drawings) between each of the mandrels 330 may also be greater than the gap G1 between each mandrel 130, according to the product requirements.

Figure 6:
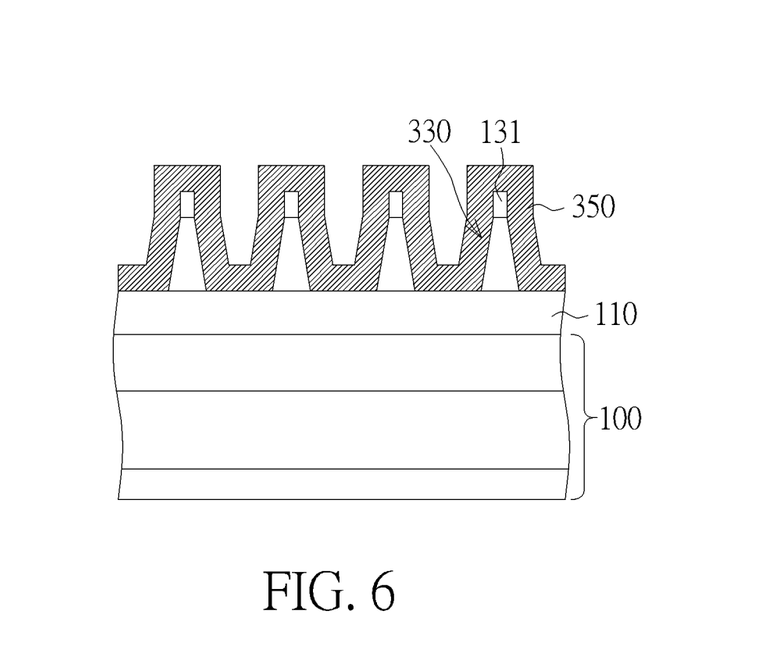
FIG. 6 shows a cross-sectional view of a semiconductor structure after forming a spacer material layer.
Figure 7:
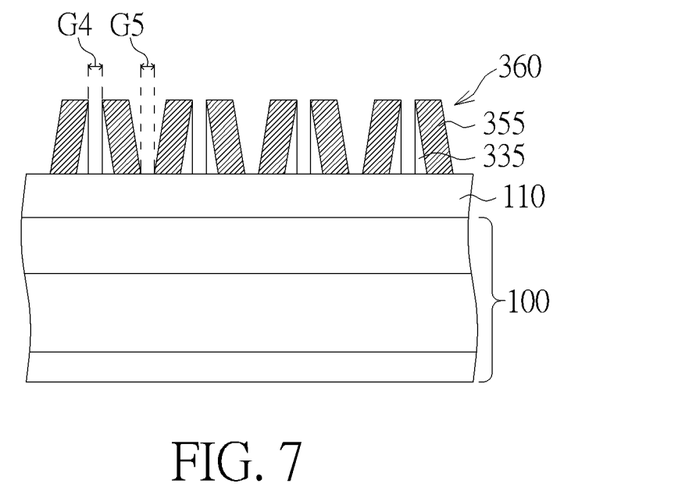
FIG. 7 shows a cross-sectional view of a semiconductor structure after forming masks.

As shown in FIG. 6, a spacer material layer 350 is formed on the substrate 100, to cover the mandrels 330 and the target layer 110 underneath. The spacer material layer 350 may optionally include the same material as the aforementioned spacer material layer 150, such as silicon oxide, or may also include a different material. Then, at least an etching process is performed to sequentially remove a portion of the spacer material layer 350, the patterned masks 131, and a portion of each of the mandrels 330. Precisely, an etching back process is firstly performed on the spacer material layer 350, to selectivity remove a portion of the spacer material layer 350, such as the spacer material layer 350 covering on the top surface of each mandrel 330 and covering on the top surface of the target layer 110. Then, a vertically etching process, such as a dry etching process or a wet etching process, is performed on the exposed surfaces of the pattern masks 131 and the mandrels 330 underneath, to selectivity remove the pattern masks 131 and to further remove the mandrels 330 under the pattern masks 131, as shown in FIG. 7. In one embodiment, the vertically etching is carried out by introducing carbonyl sulfide (COS) gas with a flowing rate of 35-45 sccm, nitrogen ($N_2$) gas with a flowing rate of 200-250 sccm, and oxygen ($O_2$) gas with a flowing rate of 80-150 sccm, under a reaction pressure of 10-12 mTorr, and a plasma power of 400-600 W, but is not limited thereto.

After the vertically etching process, each of the mandrels 330 and the spacer material layer 350 covering on each mandrel 330 are etched to form two separated portions. The remained portion (namely the unetched portion) of each of the mandrels 330 forms two unetched portions 335, the remained portion (namely the unetched portion) of the spacer material layer 350 covering on each mandrel 330 forms two spacer portions 355, and the two unetched portions 335 are formed at the inner sides of the two spacer portions 355 to directly in contact with adjacent spacer portions 355, as shown in FIG. 7. It is noted that, the two unetched portions formed at the inner sides of the two spacer portions 355 are spaced from each other by a gap G4, and the gap G4 is substantially the same as the dimension D1 of each mandrel 330. On the other hand, the two adjacent spacer portions 355 are spaced from each other by a gap G5. In the present embodiment, the gap G4 is substantially the same as the gap G5 by adjusting the thickness of the spacer material layer 350, but is not limited thereto. In another embodiment, the gap G4 may also be different from the gap G5, optionally. With the aforementioned arrangement, each of the unetched portions 335 formed from each mandrels 330 and each of the spacer portion 355 formed from the spacer material layer 350 covering on each mandrel 330 may together form a mask 360, and each of the masks 360 are spaced by the gaps G4, G5, as shown in FIG. 7.

Figure 8:
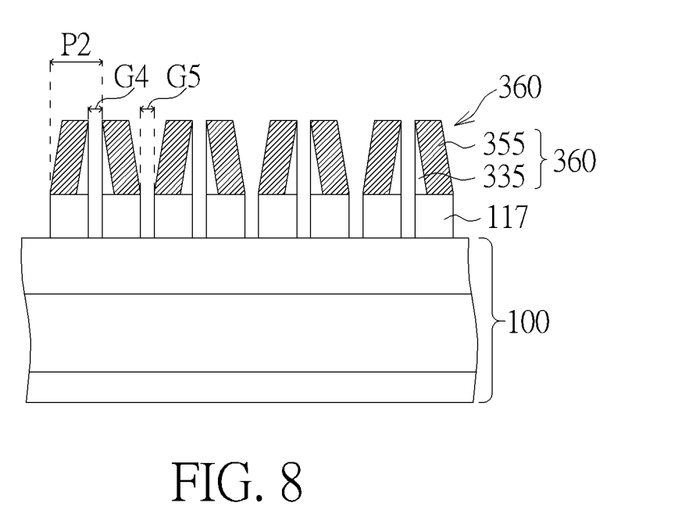
FIG. 8 shows a cross-sectional view of a semiconductor structure after performing etching process.

Then, as shown in FIG. 8, each of the masks 360 are used as an etching mask to pattern the target layer 110 underneath, to form required target patterns 117 or target structures (not shown in the drawings). The target patterns 117 is formed in accordance with each masks 360, so that, each of the target patterns 117 are spaced by the gaps G4, G5, with the gaps G4, G5 being smaller than that of the gap G2 between the target patterns in the aforementioned first embodiment. In the present embodiment, for easy comparison with the aforementioned first embodiment, it is preferably to adjust the process parameters to make the target patterns 117 formed in the present embodiment having the same pitch P2 (about 75-85 nm) as the target patterns 115 of the aforementioned first embodiment, but is not limited thereto. In other words, although the target patterns 117 of the present embodiment have the same pitch P2, the gaps G4, G5 between each target patterns 117 are significantly smaller than the gap G2 between each target patterns 115 in the aforementioned embodiment. That is, each target patterns 117 namely has an enlarged dimension than that of each target pattern 115, as shown in FIG. 8. Also, each target patterns 117 further has an enlarged dimension than the dimension D1 of each mandrel 330, and which is preferably the same or greater than the dimension D2 of each mandrel 330.

Figure 9:
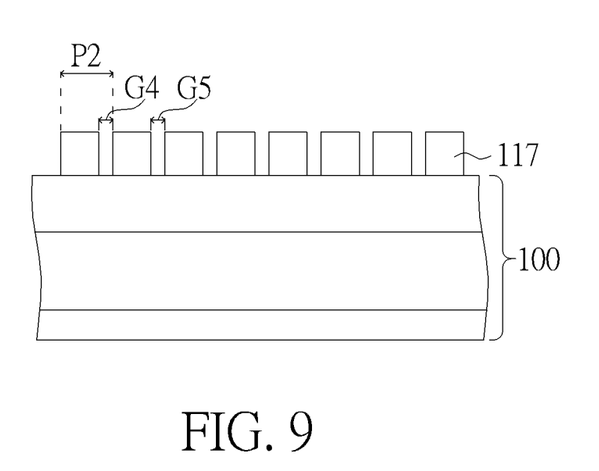
FIG. 9 shows a cross-sectional view of a semiconductor structure after forming patterns.

Following these, as shown in FIG. 9, the masks 360 are completely removed, to remain the target patterns 117 underneath. In the present embodiment, the target patterns 117 may further be used as a mask in a subsequent etching process, for patterning the substrate 100, such as the semiconductor layer thereof and/or the insulating layer formed on the semiconductor layer. Also, in the embodiment having the semiconductor layer, the conductive layer or the non-conductive layer as the substrate, the target patterns 117 may be used to patterning such semiconductor layer, the conductive layer or the non-conductive layer based on the process requirements of the subsequent process.

According to the above steps, a forming process of a semiconductor structure according to the second embodiment of the present invention is completed. In the present embodiment, although the SIT technique is still used to form the target patterns 117 or other target structures, the target layer 110 is namely patterned by using a mask formed together from a portion of each mandrel 330 and a portion of the spacer material layer 350 covering on each mandrel 330. That is, each of the target patterns 117 is formed according to one spacer portion 355 and one unetched portion 335 in contact with each other. Thus, the target patterns 117 of the present embodiment may therefore obtains an enlarged dimension, in comparison with the target patterns 115 only formed through the spacers 155. In one embodiment, a dimension of the target patterns 117 is substantially the same or greater than the dimension D2 of the mandrels 330. In this way, the forming process of the present embodiment is allowable to form target structures with uniform, enlarged dimension in a denser layout, under a simplified process flow.

Overall speaking, the present invention provides method through a SIT technique to form target patterns or target structures. In comparison with general SIT technique by defining the target patterns or target structures only through the spacers after completely removing the mandrels, the method of the present invention directly uses an unetched portion formed from each mandrel and an unetched portion (namely the spacer portion) formed from the spacer material layer covering on each mandrel to together form each mask, and then the target patterns or the target structures are defined by such masks. That is, the target patterns or the target structures are allowable to shrink the gaps therebetween or to enlarge the dimension thereof as far as possible, under a maintain pitch such as about 75-85 nm. Thus, through the aforementioned arrangement, the method of the present invention may be practical applied to a semiconductor memory device process, for forming patterns or structures with uniform, enlarged dimension in a denser layout, based on product requirements. For example, the present invention may be used in a dynamic random access memory (DRAM) device process, using the target patterns 117 formed in the aforementioned embodiment as a mask to define the storage node pads (SN pads) which are in contact with each storage node contacts (SNCs). That is, the SN pad within the DRAM device may therefore be formed with uniform, enlarged dimension in a denser layout, so as to gain a preferably structure and better functions to the DRAM device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
   forming a target layer on a substrate;
   forming a plurality of mandrels on the target layer;
   forming a material layer on the target layer to cover the mandrels;
   performing an etching process to form a plurality of masks, wherein the etching process partially removes each of the mandrels to form a mandrel portion, and partially removes the material layer covered on each of the mandrels to form a spacer portion, wherein each of the masks comprises the mandrel portion and the spacer portion, and the mandrel portion and the spacer portion directly contacts with each other; and
   patterning the target layer through the masks, to form a plurality of patterns.

2. The method of forming a semiconductor structure according to claim 1, wherein the patterns are spaced from each other by a plurality of gaps, and a dimension of each of the gaps is smaller than a dimension of each of the mandrels.

3. The method of forming a semiconductor structure according to claim 2, wherein the gaps comprises a first gap and a second gap, the first gap is formed between any two adjacent mandrel portions, and the second gap is formed between any two adjacent spacer portions.

4. The method of forming a semiconductor structure according to claim 1, wherein each of the mandrels comprises a first dimension at a top portion thereof, and a second dimension at a bottom portion thereof, and the second dimension is greater than the first dimension.

5. The method of forming a semiconductor structure according to claim 4, wherein the patterns are spaced from each other by a plurality of gaps, and a dimension of each of the gaps is equal to the first dimension of each of the mandrels.

6. The method of forming a semiconductor structure according to claim 4, wherein a dimension of each of the patterns is larger than the first dimension of each of the mandrels.

7. The method of forming a semiconductor device according to claim 1, wherein the etching process comprises providing carbonyl sulfide for reaction.

8. The method of forming a semiconductor device according to claim 1, wherein the etching process comprises providing oxygen gas and nitrogen gas for reaction.

9. A method of forming a semiconductor structure, comprising:
   forming a target layer on a substrate;
   forming a plurality of mandrels on the target layer;
   forming a material layer on the target layer to cover the mandrels;
   performing an etching process to partially remove each of the mandrels and the material layer covering on each of the mandrels, to form a plurality of masks, wherein after the etching process, each of the mandrels are etched to form two mandrel portions, and the material layer covering on each of the mandrels are etched to form two spacer portions; and
   patterning the target layer through the masks, to form a plurality of patterns.

10. The method of forming a semiconductor structure according to claim 9, wherein each of the masks comprises one of the mandrel portions and one of the spacer portions adjacent and directly in contact with each other.

11. The method of forming a semiconductor structure according to claim 9, wherein the patterns are spaced from each other by a plurality of gaps, and a dimension of each of the gaps is smaller than a dimension of each of the mandrels.

12. The method of forming a semiconductor structure according to claim 11, wherein the gaps comprises a first gap and a second gap, the first gap is formed between any two adjacent mandrel portions, and the second gap is formed between any two adjacent spacer portions.

13. The method of forming a semiconductor device according to claim 9, wherein the etching process comprises providing carbonyl sulfide for reaction.

14. The method of forming a semiconductor device according to claim 9, wherein the etching process comprises providing oxygen gas and nitrogen gas for reaction.

* * * * *